(12) United States Patent
O'Sullivan

(10) Patent No.: US 9,929,038 B2
(45) Date of Patent: Mar. 27, 2018

(54) INSULATING STRUCTURE, A METHOD OF FORMING AN INSULATING STRUCTURE, AND A CHIP SCALE ISOLATOR INCLUDING SUCH AN INSULATING STRUCTURE

(71) Applicant: Analog Devices Global, Hamilton (BM)

(72) Inventor: Laurence Brendan O'Sullivan, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/788,410

(22) Filed: Mar. 7, 2013

(65) Prior Publication Data
US 2014/0252533 A1 Sep. 11, 2014

(51) Int. Cl.
| H01L 21/70 | (2006.01) |
|---|---|
| H01L 21/762 | (2006.01) |
| H01L 29/06 | (2006.01) |
| H01L 23/31 | (2006.01) |

(Continued)

(52) U.S. Cl.
CPC ........ *H01L 21/762* (2013.01); *H01L 23/3114* (2013.01); *H01L 23/49575* (2013.01); *H01L 23/50* (2013.01); *H01L 29/0649* (2013.01); H01L 2224/05553 (2013.01); H01L 2224/48091 (2013.01); H01L 2224/48137 (2013.01); H01L 2224/48247 (2013.01); H01L 2224/48257 (2013.01); H01L 2224/49107 (2013.01);

(Continued)

(58) Field of Classification Search
CPC . H01L 2224/48091; H01L 2224/48247; H01L 2224/49171; H01L 2924/00; H01L 2924/00014; H01L 21/762; H01L 2224/48137; H01L 2224/49175; H01L 23/3114; H01L 23/49575; H01L 23/50; H01L 29/0649

USPC .... 257/506, 632, 48, 531, 666; 307/91, 104; 361/813, 767, 783; 455/78, 550.1; 336/200, 192, 1, 223; 29/606, 602.1; 324/415

See application file for complete search history.

(56) References Cited

U.S. PATENT DOCUMENTS

| 6,614,643 B1 | 9/2003 | Morita |
|---|---|---|
| 6,927,662 B2 | 8/2005 | Kahlmann et al. |
| 7,489,526 B2 | 2/2009 | Chen et al. |

(Continued)

FOREIGN PATENT DOCUMENTS

| CN | 104022113 A1 | 9/2014 |
|---|---|---|
| DE | 10 2005 025083 A1 | 12/2006 |

(Continued)

OTHER PUBLICATIONS http://www.youtube.com/watch?v=sHt12p03RSO, "iCoupler Technology: An Alternative to Optocouplers".

(Continued)

*Primary Examiner* — Mohammed Shamsuzzaman
(74) *Attorney, Agent, or Firm* — Wolf, Greenfield & Sacks, P.C.

(57) ABSTRACT

A method of forming an insulating structure, comprising forming an insulating region comprising at least one electrical or electronic component or part thereof embedded within the insulating region, and forming a surface structure in a surface of the insulating region.

20 Claims, 13 Drawing Sheets

(51) Int. Cl.
*H01L 23/495* (2006.01)
*H01L 23/50* (2006.01)

(52) U.S. Cl.
CPC .............. *H01L 2224/49171* (2013.01); *H01L 2224/49175* (2013.01); *H01L 2924/181* (2013.01)

(56) References Cited

U.S. PATENT DOCUMENTS

| | | |
|---|---|---|
| 7,947,600 B2 | 5/2011 | Iwaya et al. |
| 8,237,534 B2 | 8/2012 | Fouquet et al. |
| 8,364,195 B2* | 1/2013 | Spina ............... H01Q 1/38 307/104 |
| 8,378,776 B1* | 2/2013 | Gabrys ............ H01L 23/5223 257/277 |
| 8,427,844 B2* | 4/2013 | Ho .................. H01F 19/08 257/676 |
| 8,446,243 B2 | 5/2013 | Strzalkowski et al. |
| 8,519,506 B2* | 8/2013 | Hopper ............ H01L 23/147 257/446 |
| 9,105,391 B2 | 8/2015 | Fouquet et al. |
| 2001/0011761 A1 | 8/2001 | Imoto |
| 2002/0052106 A1 | 5/2002 | Ikura |
| 2004/0026776 A1 | 2/2004 | Brand |
| 2004/0056749 A1* | 3/2004 | Kahlmann ............ H01L 27/08 336/200 |
| 2005/0026351 A1 | 2/2005 | Farrar |
| 2006/0071309 A1 | 4/2006 | Kato |
| 2006/0075836 A1 | 4/2006 | Zribi |
| 2006/0077028 A1 | 4/2006 | Huang |
| 2007/0121249 A1* | 5/2007 | Parker ............... G01Q 33/04 360/123.1 |
| 2008/0030080 A1* | 2/2008 | Chen ............... H01F 17/0006 307/91 |
| 2008/0061631 A1* | 3/2008 | Fouquet ............ H01F 19/08 307/109 |
| 2008/0179963 A1* | 7/2008 | Fouquet ............ H01F 19/08 307/104 |
| 2008/0311862 A1* | 12/2008 | Spina ............... H01Q 1/38 455/78 |
| 2009/0098735 A1 | 4/2009 | Cho |
| 2009/0104769 A1* | 4/2009 | Lee ................. H01L 23/3114 438/653 |
| 2009/0160011 A1 | 6/2009 | Park |
| 2009/0280314 A1 | 11/2009 | Mahler et al. |
| 2009/0280646 A1 | 11/2009 | Iwaya et al. |
| 2011/0095392 A1 | 4/2011 | Wahl et al. |
| 2012/0168901 A1 | 7/2012 | Santangelo et al. |
| 2012/0181874 A1 | 7/2012 | Willkofer et al. |
| 2014/0151856 A1* | 6/2014 | Otremba ......... H01L 23/49827 257/632 |
| 2014/0151889 A1 | 6/2014 | Plekhanov et al. |
| 2014/0175602 A1 | 6/2014 | Funaya et al. |
| 2015/0357113 A1 | 12/2015 | Scholz |
| 2017/0117084 A1 | 4/2017 | Murphy et al. |
| 2017/0117602 A1 | 4/2017 | McLoughlin et al. |

FOREIGN PATENT DOCUMENTS

| | | |
|---|---|---|
| EP | 1 156 525 A1 | 11/2001 |
| EP | 2348572 A1 | 7/2011 |
| EP | 2 775 522 A1 | 9/2014 |
| EP | 16193510.1 | 1/2017 |
| GB | 2132817 A | 7/1984 |

OTHER PUBLICATIONS http://www.analog.com/en/interface-isolation/digital-isolators/products/index.html.
EP Communication with European Search Report issued in the counterpart European Application No. 14156529.1, communication dated Jun. 12, 2014, 8 pages.
Examination Report dated Mar. 16, 2017 for Application No. EP 14156529.1.
Extended European Search Report dated Jan. 20, 2017 for Application No. EP 16193510.1.
U.S. Appl. No. 14/922,037, filed Oct. 23, 2015, McLoughlin et al.
U.S. Appl. No. 15/179,741, filed Jun. 10, 2016, Murphy et al.

* cited by examiner

INSULATING STRUCTURE, A METHOD OF FORMING AN INSULATING STRUCTURE, AND A CHIP SCALE ISOLATOR INCLUDING SUCH AN INSULATING STRUCTURE

FIELD OF THE INVENTION

The present disclosure relates to the formation of insulating structures on integrated circuit or on chip scale dimensions, and the inclusion of such structures within typical integrated circuit packages.

BACKGROUND

Most electronic circuits are implemented within microelectronic circuits, commonly referred to as "chips". Such a chip comprises a semiconductor die carrying the microelectronic circuit encapsulated within a plastics case. This enables the chip to be bonded or soldered to circuit boards and the like for the formation into more complex products. Many applications of microelectronic circuitry may require interfacing from a relatively low voltage side, where for example the supply rails may differ from each other by only a few volts, to higher voltage components as might be found in the energy, signaling, automation, communications or motor control arenas. There are also safety critical applications such as medical applications, where high voltages must not be allowed to propagate from the circuit towards a patient being monitored. Although these high voltages may not be generated deliberately, they might occur in certain fault modes, for example if a power supply were to develop a fault. It is known to isolate low voltage and high voltage sides of a circuit from one another using "isolators". These have typically involved discrete components, such a signal transformers, being mounted on a circuit board between a low voltage side of the board and the high voltage side of the board. More recently "chip scale" isolators have become available. Within a "chip scale" isolator the low voltage and high voltage sides of the circuit are provided within a plastics package of the type known in the provision of integrated circuits, such as a dual in line package. The reduced dimensions in chip scale isolators start to give rise to breakdown mechanisms not seen in non-chip scale, i.e. discrete component isolators.

SUMMARY

According to a first aspect of the present invention there is provided a method of forming an insulating structure, comprising forming an insulating region comprising at least one electrical or electronic component, or part thereof, embedded within the insulating region, and forming a surface structure in a surface of the insulating region.

The surface structure may comprise features that extend from, or are recessed into, what would otherwise be a planar surface of the insulating region. The use of a non-planar surface increases the length of a discharge path between two points on the surface compared to the use of a planar surface. This increased discharge path length acts to inhibit breakdown mechanisms operating at the surface of the insulator, or at the boundary between two insulators. Provision of a non-planar surface also gives the possibility of greater mechanical or chemical adhesion between the surfaces.

In an embodiment, the surface structure comprises a plurality of trenches or a plurality of walls, or a combination thereof. Trenches can be regarded as being bounded by walls. Such a structure gives rise to a reasonably abrupt change in the direction of the surface and, without being bound by any particular theory such abrupt changes seem to be effective at inhibiting current flow along the surface of the insulator. Such structures also provide enhanced mechanical keying between the insulating region, and insulating mould compounds that are routinely provided in the field of semiconductor packaging when placing semiconductor dies within plastic "chip" packages.

The insulating region may be formed by depositing a plurality of insulating layers over a substrate. The insulating layers may be formed of polyimide or any other suitable material. Other suitable insulators may include benzocyclobutane (BCB), epoxy and/or polymers such as SU8 (which is used in semiconductor fabrication as a photoresist) or insulating oxides such as silicon dioxide. The substrate might be an insulating substrate, such as glass or polymer or plastics, or may be a semiconductor substrate such as silicon. Part of the coupling component may be provided on the silicon substrate. Thus, using conventional integrated circuit processing techniques a coil such as an aluminum coil may be fabricated over a silicon substrate. Other metals may also be used. The coil may itself be covered by a passivation layer, such as silicon dioxide. One or more layers of a suitable insulating material, such as polyimide, may then be deposited above the coil. This allows the thickness of the polyimide, and hence the breakdown voltage of the insulator, to be controlled. Then a second coil, for example of aluminum, gold or another suitable metal may be deposited over an upper surface of the polyimide in order that the two coils cooperate to form a transformer. One or more further layers of insulation, such as polyimide, BCB, SU8 etc, may then be placed over the additional coil. Each layer of insulation may lie above, and extend around the sides of, each preceding layer. If desired, further components embedded in further layers of insulator may be fabricated. Finally the outermost layer of insulator may be masked and selectively etched so as to form a pattern of trenches therein which, in use, can inter-engage with a mould compound, or indeed a further insulating compound, in order to form a secure bond over the uppermost layer of polyimide. Such a structure prevents the breakdown mechanisms resulting from "tracking" across the surface of the polyimide.

According to a further aspect there is provided an insulating structure within an integrated circuit package, the insulating structure comprising an electrical or electronic component, or at least part thereof, embedded within an insulating structure, wherein the insulating structure has a textured or ribbed surface.

Advantageously the insulating structure may be used to form a signal conveying component, such as a transformer. The insulating structure may be used to form an isolator wherein a first circuit that performs at least an input function is formed on a first die and a second circuit which performs at least an output function is formed on a second die, and where the first and second circuits are interconnected via the insulating structure. The first and second dies may be formed on respective lead frames within the integrated circuit package, i.e. within the chip. The insulating structure may be provided on either of the first or second dies, or in a further arrangement may be provided on a third die or substrate. Where a third substrate is used it does not have to be a semiconducting substrate, and may be formed of any suitable insulating material such as glass, plastics, or polymers. The third die may be carried on its own lead frame, or may be secured to one of the other lead frames by way of an insulating layer between the third substrate and the lead frame. The two, or three, substrates may then be embedded within a known mould compound during insertion into a plastics integrated circuit package.

According to a further embodiment there is provided a method of manufacturing an electrical device comprising at least one electrical or electronic component provided within a package that carries connectors for establishing electrical connection to the circuit, and wherein the circuit comprises at least one component encapsulated in an insulator, the method comprising forming a plurality of structures extending substantially perpendicularly to the surface of the insulator, and embedding the circuit encapsulated within the insulator in a mould compound within the package, wherein the mould compound engages with the plurality of structures at the surface of the insulator.

As used herein, the term "embedded" allows for the deliberate formation of connection regions to or from the at least one component such that electrical connection can be made to the component.

BRIEF DESCRIPTION OF THE FIGURES

Embodiments of the present invention will now be described, by way of non-limiting example only, with reference to the accompanying Figures, in which.

DESCRIPTION OF EXAMPLE EMBODIMENTS

Figure 1:
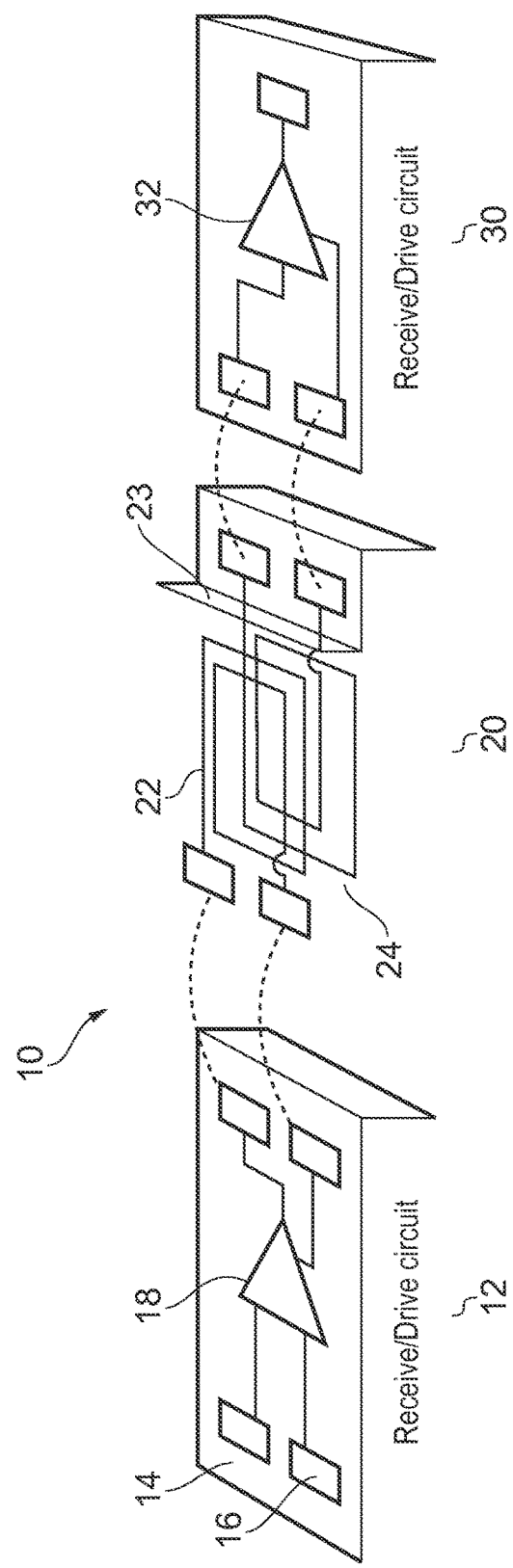
FIG. 1 is a schematic diagram of an isolator providing galvanic isolation between an input circuit and an output circuit, by way of an intermediate transformer formed on a substrate using techniques comparable with very large scale integration (VLSI) formation of electronic circuits.

FIG. 1 schematically represents the components within a signal isolator which acts to receive an input signal at the first voltage or a first voltage range, which may be a relatively high voltage, and to convey it at a lower voltage for processing by further components, not shown, such as a microprocessor. Such an isolator 10 typically comprises a receive circuit 12 that has input terminals 14 and 16 for receiving an input signal, and processing electronics 18 which acts to convert the signal into a form suitable for transmission across an isolation circuit 20. The processing electronics 18 may, for example, encode a voltage by converting it to the frequency domain, or may encode a logic signal by providing a high frequency sinusoid to the isolation circuit when the logic signal is asserted, and inhibiting provision of the sinusoid to the isolation circuit when the logic signal is not asserted. The isolation circuit 20 in this example comprises a first transformer coil 22 magnetically coupled to a second transformer coil 24. The magnetic coupling may simply be a result of the relative proximity of the coils to one another. The coils are separated by an insulating material 23. Advantageously one or both of the coils are also embedded in an insulating material. An output of the coil 22 is provided to an output circuit 30 where a further electronic circuit 32 processes the signals received from the second coil 24 in order to reconstitute a representation of the input signal provided to the drive circuit 12. The arrangement shown in FIG. 1 is highly simplified, and, for example, a single channel may include two transformers such that the signal can be conveyed in a differential manner, or in a phase or frequency modulated manner. Additionally, it may be desirable to send signals back from the low voltage side of the circuit 30 to the higher voltage side 12, and therefore each element may be provided in a bi-directional manner, and the isolator may be used to convey signals in a bi-directional manner, or additional isolators may be provided such that some of the isolators may be dedicated for transmission of data in one direction and other of the isolators may be dedicated for the transmission of data in a second direction. Furthermore, if the input receiver circuitry 12 is unable to derive power from the equipment that it is connected to, then it is also possible to use the transformers to provide power to run the receiver circuit.

As shown in FIG. 1, the receiver circuit 12, the isolator 20, and the output circuit 30 have been provided on respective substrates. It is desirable that the receiver at the high voltage side and the low voltage output side circuit 30 are provided on respective substrates, but either of those substrates may optionally incorporate the isolator 20.

Figure 2:
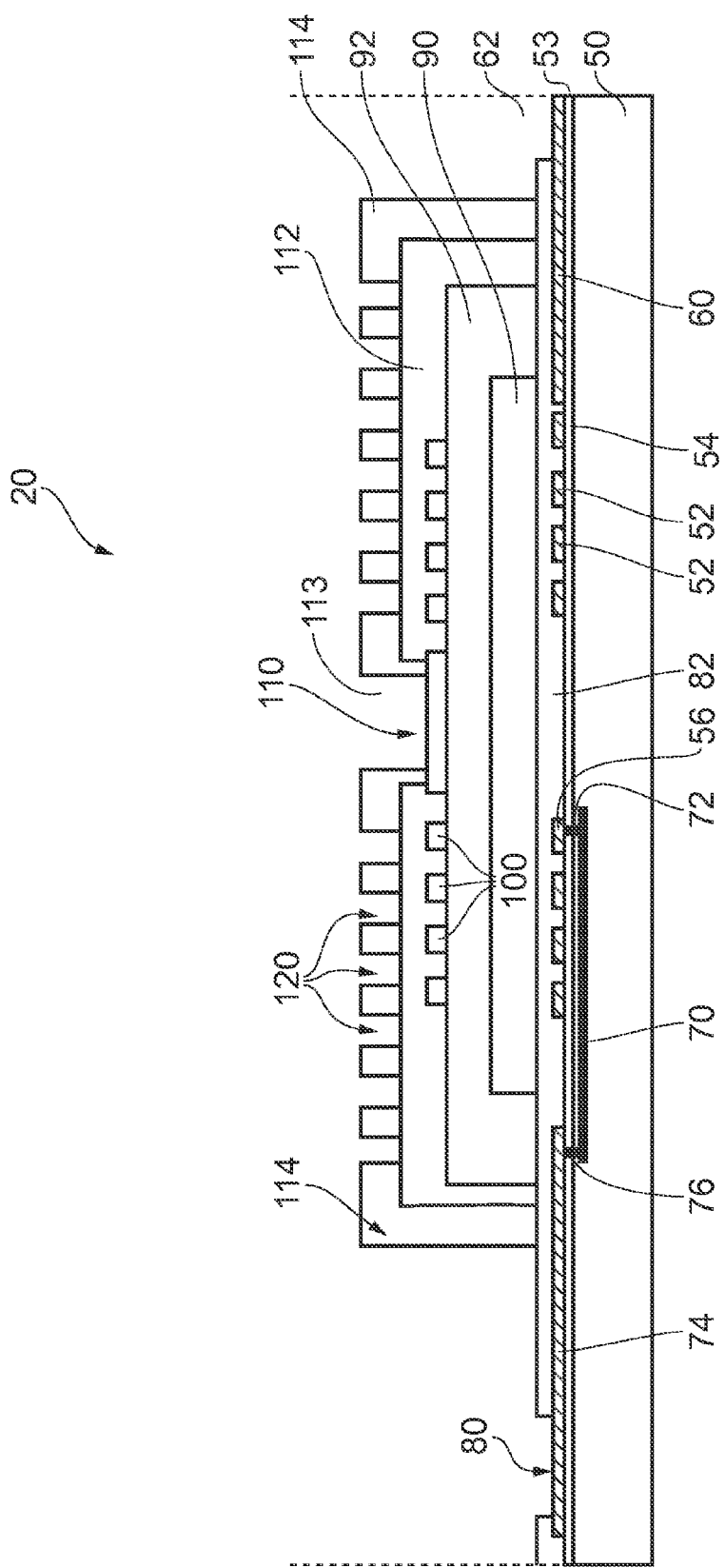
FIG. 2 is a cross section through an isolating transformer having one coil formed over a substrate and a second coil embedded within an insulator, and having a surface structure formed in an upmost layer of insulator.

FIG. 2 is a cross section through an embodiment of an isolator 20. The diagram is not to scale, and in particular the thickness of the substrate 50 is, much greater than shown in FIG. 2. In the arrangement shown in FIG. 2 a substrate 50, such as a semiconductor wafer, acts as a carrier for the insulating structure used to form a transformer based signal isolator. A first coil 52 formed as a spiraling metal track is provided at the surface of the substrate 50. A layer of insulator 53 such as silicon dioxide insulates the metal track from the substrate. The metal track may be formed of Aluminum, Gold or any other suitable metal. Other conducting materials may also be used. The nature of a spiral track is that a connection is made to a radially outermost most part 54 of the spiral 52 and that a connection must also be made to radially innermost part 56 of the spiral 52. The connection to the outermost part 54 can be easily accomplished by extending the metal layer used to form the spiral such that it forms a track 60 extending towards a bond pad region 62. A connection to the innermost portion 56 of the spiral has to be made in a plane above or below the plane of the spiral. In the arrangement shown in FIG. 2 a decision has been made to make the interconnection 70 below the plane of the spiral conductor 52, for example by forming a highly doped region or a further metal layer 70 which connects to the region 56 by way of a first via 72 and which connects to a further section of metal track 74 by way of a further via 76. Thus a further insulation oxide layer (not shown) may lie beneath the metal layer 70 so as to insulate it from the substrate. A further section of metal track 74 extends towards a bond pad region 80. After the first coil 52 is formed, the metal tracks may be covered by a thin layer of passivation 82, such as silicon dioxide, or some other insulator, except in the regions of the bond pads 62 and 80 where the passivation is etched away. The fabrication of such structures is known to the person skilled in the art and need not be described further here.

It is known to the person skilled in the art that insulators can typically withstand the maximum electric field across them before dielectric breakdown occurs and a conductive path opens through the insulator. The electric field is expressed in volts per unit distance, and hence the key to obtaining high breakdown voltages is to be able to control the thickness of the insulator. Polyimide is a compound which is suitable for use as an insulator as it has a breakdown voltage of around 800 to 900 volts per µm, and is also relatively easy to work with within the context of semiconductor fabrication processes and is largely self planarising. Other insulating materials that are commonly used in integrated circuit fabrication include BCB and SU8. Other insulating polymers and oxides may also be used. As shown in FIG. 2, a first layer of insulator 90, for example of polyimide is deposited over the region of the substrate 50 and the passivation 82 in which the first coil 52 is formed. Then a second overlapping layer 92 of insulator, such as polyimide is formed over the first region 90 so as to build up an additional thickness of the insulator. The ends of the region 92 are allowed to wrap around the ends of the region 90, such that the insulating structure increases in both depth and lateral extent. Each deposition step generally increases the thickness of the insulator by, in the case of polyimide between 10 to 16 microns. Thus after two deposition steps the insulator is typically between 20 and 32 microns thick. If necessary or desirable further layers can be deposited to form thicker structures. These thicknesses being relatively well controlled and selectable at the choice of the fabricator. Next a second metallic layer 100 is deposited over the layer 92 and patterned, for example to form a second spiral track which co-operates with the first spiral track to form a transformer. The second metal layer 100 may be of aluminum or another suitable metal such as gold. As with the first conductive spiral track, connections need to be made to both a centermost portion of the spiral and an edge portion. For diagrammic simplicity the connection to the outer edge portion has been omitted and can be assumed to lie either above or below the plane of the FIG. 2, whereas the central portion has been shown and represented as a bond pad 110.

Following formation of the second spiral conductive track 100, a third layer 112 of insulator, such as polyimide is deposited over the second layer 92 and over the spiral track 100. The layer 112 extends beyond and overlaps the layer 92. After formation of the layer 112 it is masked and then selectively etched so as to open up a connection aperture 113 to the bond pad 110. This step may be omitted where the spatial extent of the bond pad is such that the fabricator can reliably form deeper etches so as to form the aperture to 113 reach the bond pad in subsequent etching steps, which will be described later.

Following formation of the third layer of insulator 112 a fourth insulating layer, such as a polyimide layer 114 may be deposited over it. The fourth layer 114 may also advantageously reach around the edges of the preceding layer, i.e. the third layer 112. Following deposition and curing of the fourth layer 114, it is selectively masked in order that a surface structure can be formed within the layer 114, and then it is etched, for example, by plasma etching or other suitable etching process, to form a series of trenches 120 extending partially or wholly through the depth of the layer 114. This etching may also be sufficient to reach through to reveal the bond pad 110 by virtue of acting on a wider aperture within the mask.

Figure 3:
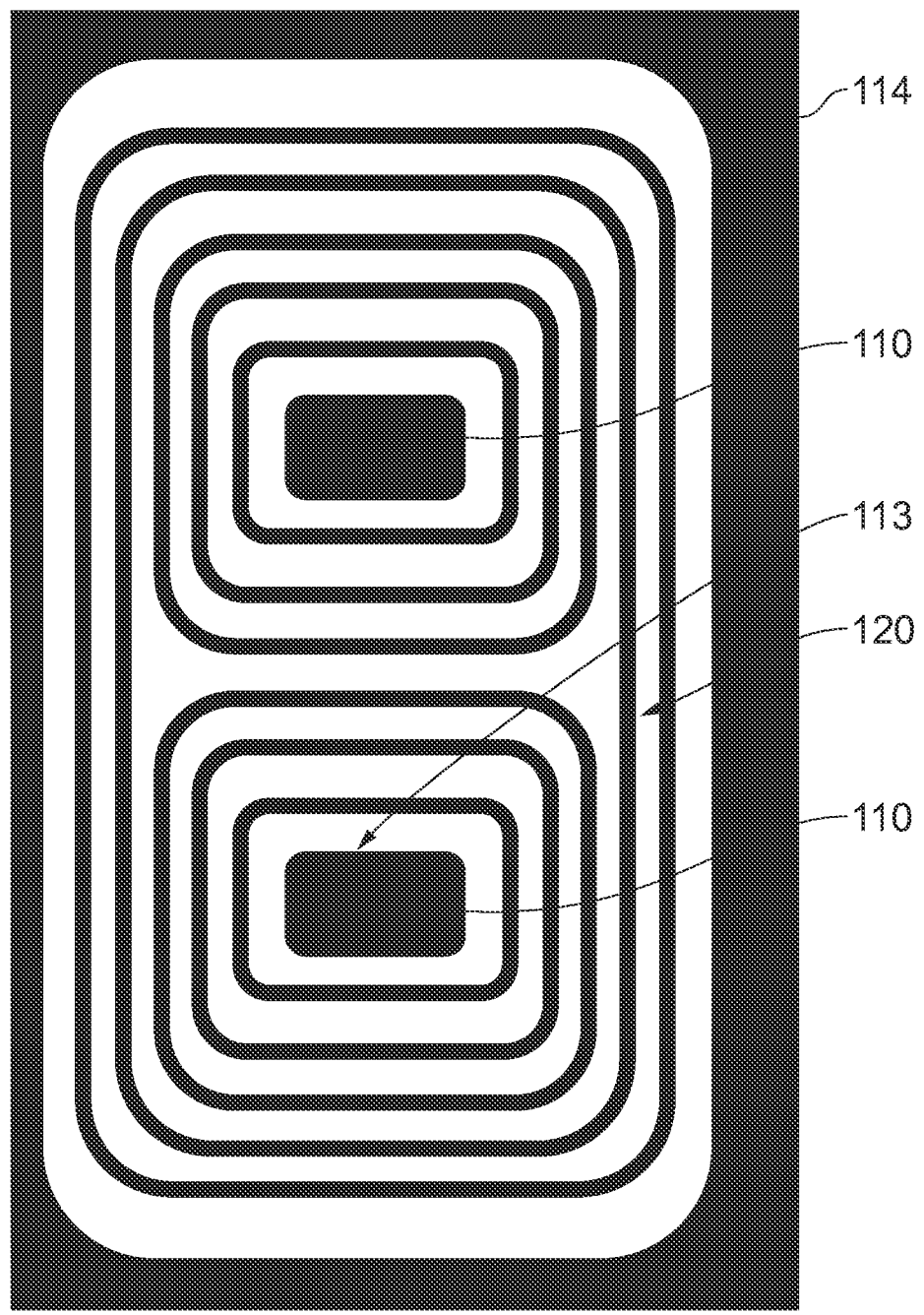
FIG. 3 is a plan view of a first surface structure configuration.

FIG. 3 is a plan view of the etching, and hence trench pattern, that may be formed in the fourth insulating layer 114. As viewed from above the layer is etched to form a pattern of concentric squares or rectangles. The rectangles may have rounded corners as shown in FIG. 3, or may be formed by trenches intersecting at substantially 90°. A pattern of trenches 120 encircles the bond pads 110 such that any breakdown path trying to form along the surface of the insulating layer 114 has to travel a much further distance and, as will be explained later, this structure also provides features to facilitate keying with a bond or a mould compound.

Figure 4:
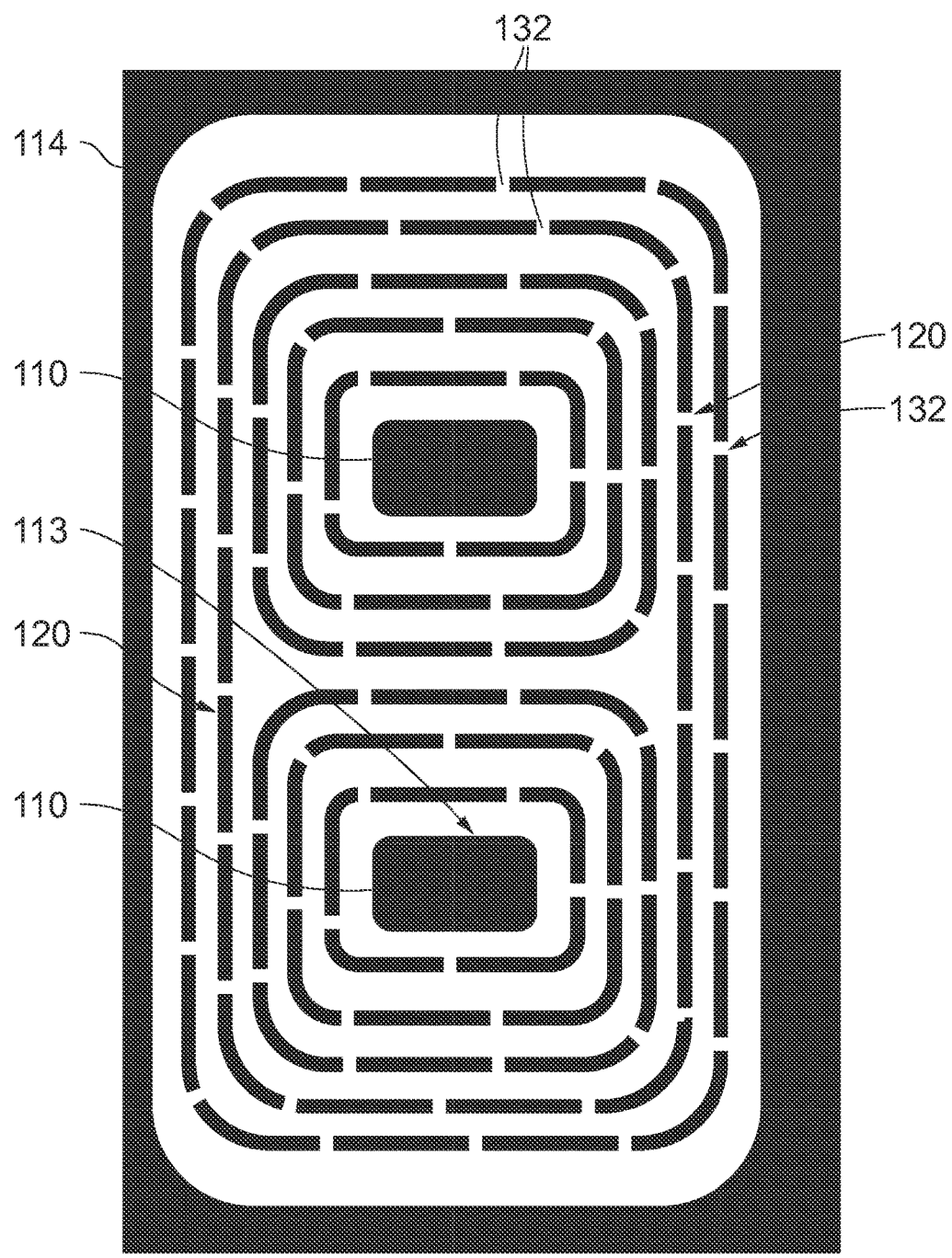
FIG. 4 shows a modification to the plan view of FIG. 3.

FIG. 4 illustrates a variation to the arrangement shown in FIG. 3 where either the walls are discontinuous, or where the trenches are discontinuous. Either of these choices is freely available to the designer. In this example the walls are discontinuous such that one trench can extend into a radially adjacent trench by virtue of linking sections 132.

Figure 5:
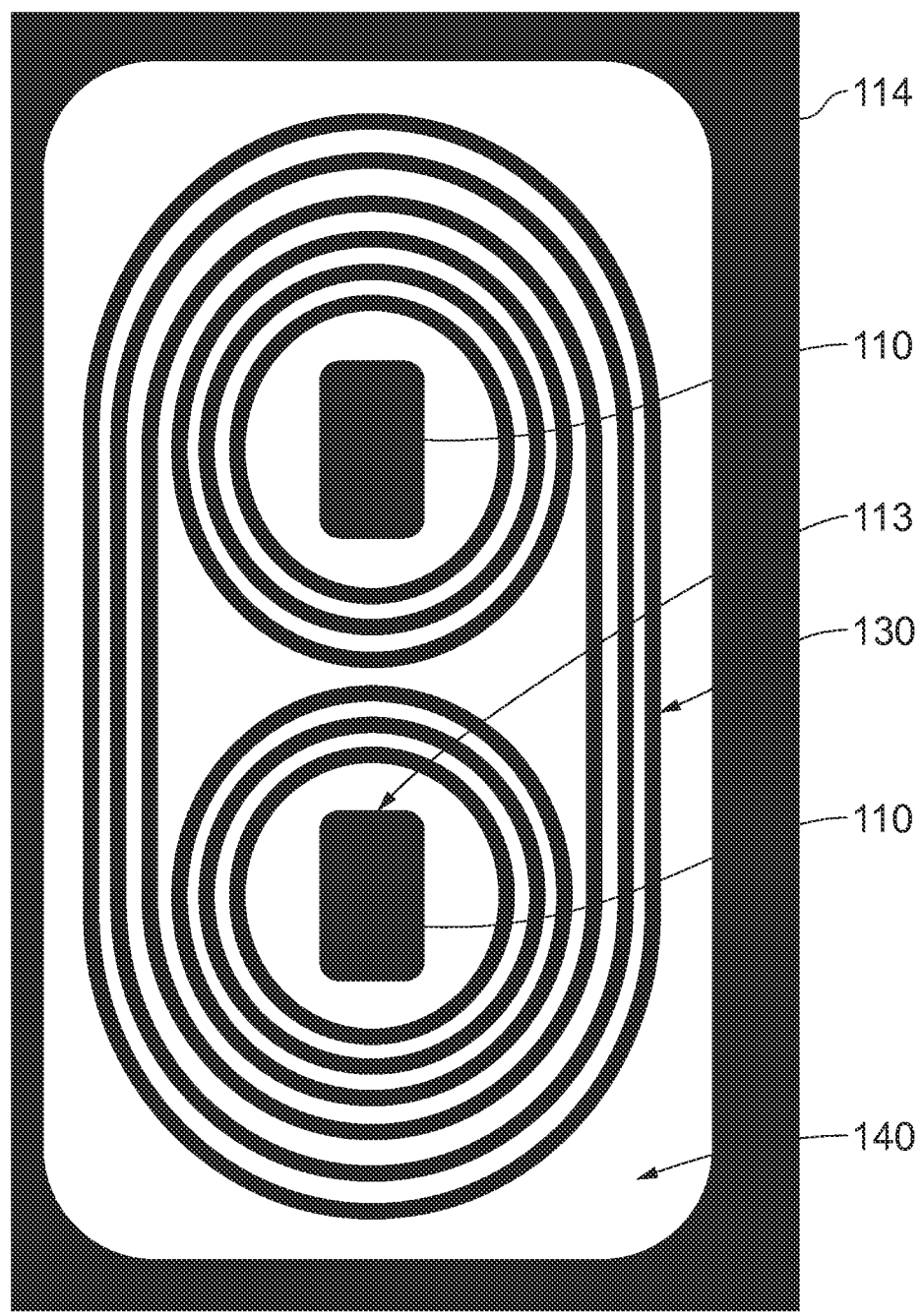
FIG. 5 is a plan view of a second surface structure arrangement.
Figure 6:
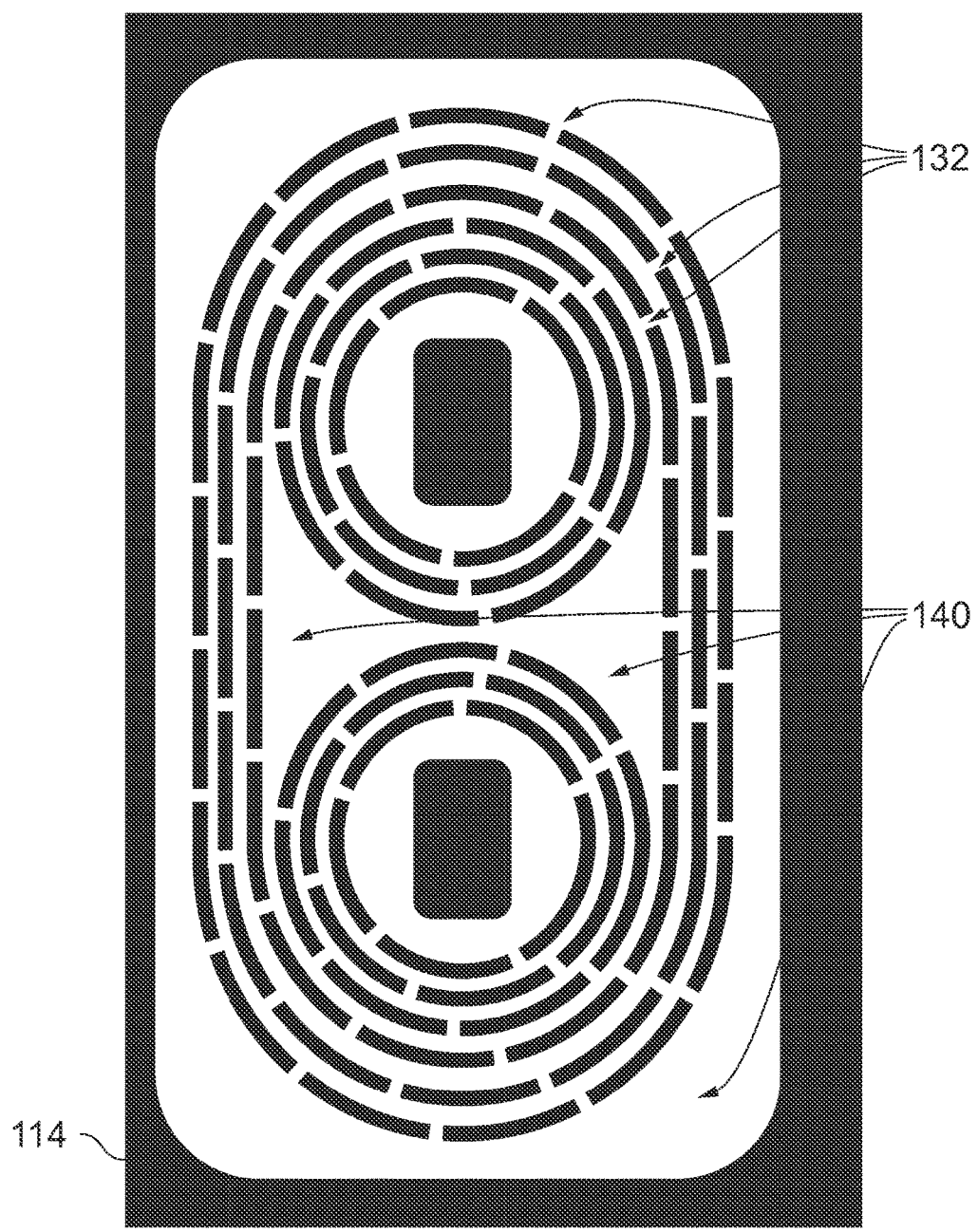
FIG. 6 shows a modification to the arrangement of FIG. 5.

The wall or trench pattern need not be formed by basically rectangular features, and FIGS. 5 and 6 show alternative patterns formed of substantially circular or elliptical walls or trenches which may include bridges extending across a trench or apertures through a wall, similar to that described with respect to FIGS. 3 and 4. As shown, substantially planar regions 140 exist around the outermost trench or wall, and these can either be left unpatterned or further patterns can be formed in them, for example arcuate trenches or walls.

Figure 8:
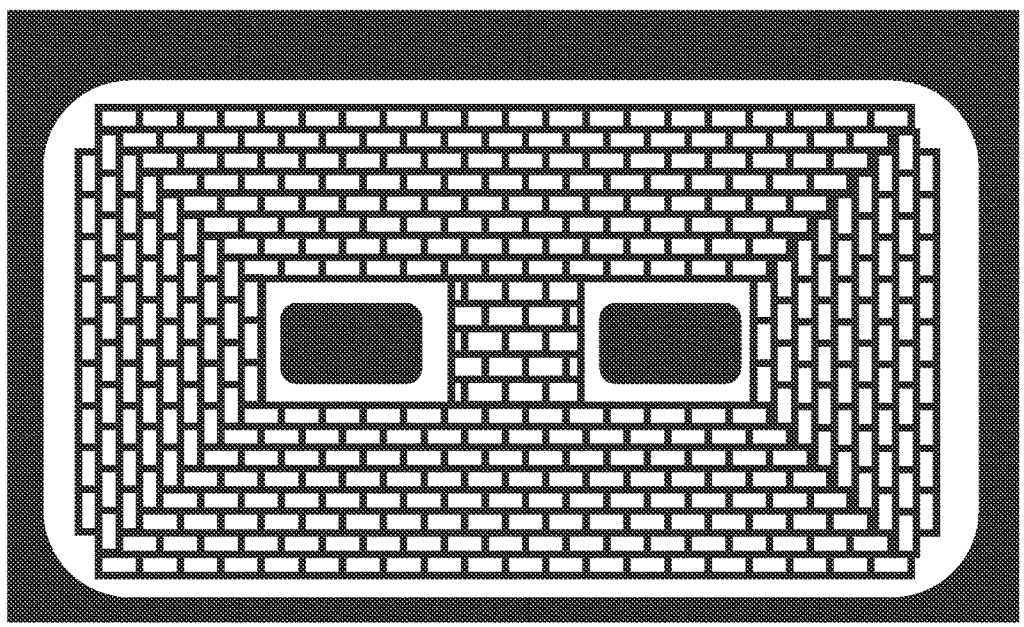
FIG. 8 is a plan view of a further surface pattern.
Figure 7:
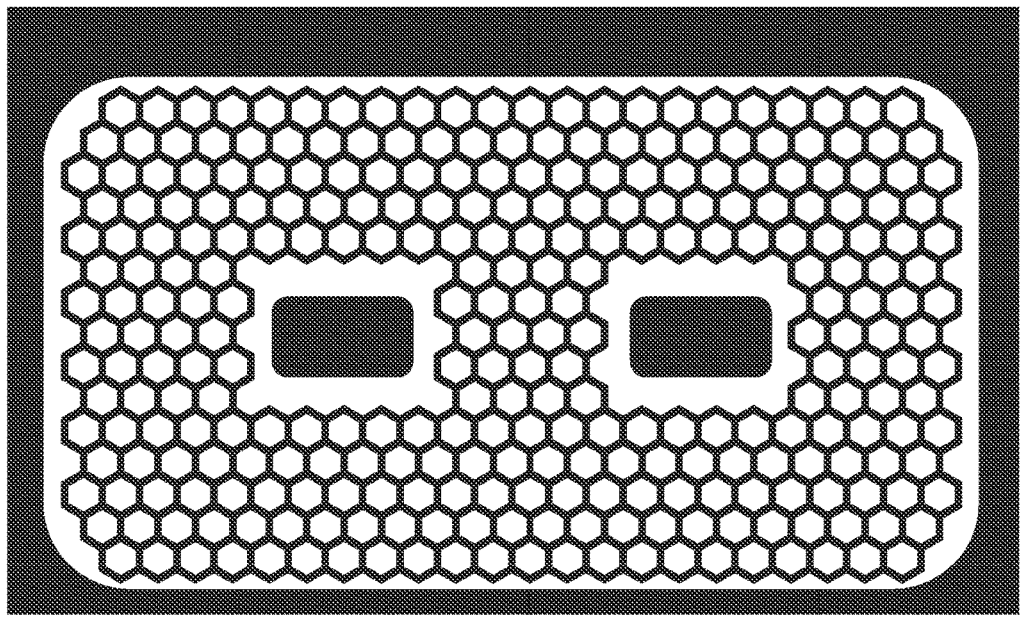
FIG. 7 is a plan view of a further surface pattern.

Further patterning structures are available, for example a honeycomb structure as shown in FIG. 7 or a block paving configuration as shown in FIG. 8. These structures are only given as examples and other structures, whether they be geometric or substantially irregular can also be provided.

Figure 9:
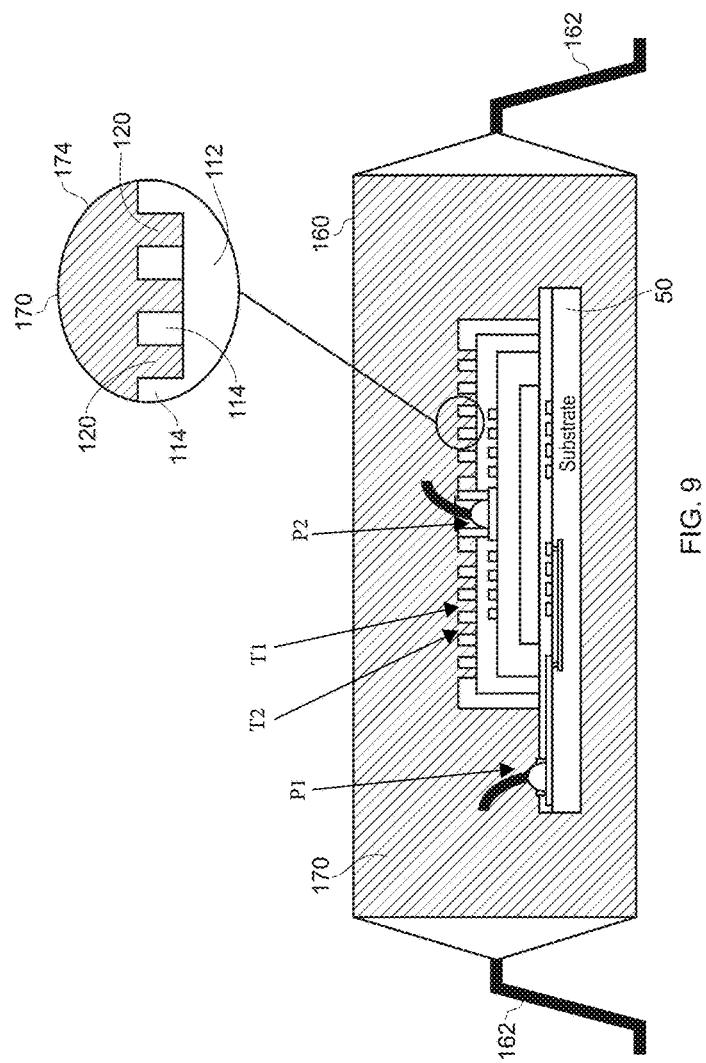
FIG. 9 is a schematic representation of a transformer formed, in part, within an insulating structure formed over a semiconductor substrate and embedded within a mould compound within an integrated circuit package.

FIG. 9 schematically illustrates the transformer based isolator discussed with respect to FIG. 2 when packaged within an integrated circuit package 160. The components are not shown to scale, for diagrammatic clarity, and also when compared to FIG. 1 only the isolator 20 has been illustrated, and the receiver circuit 12 and output circuit 30 have not been illustrated although it is to be understood that corresponding components are included within the integrated circuit package 160. In this example the package 160 is of a dual inline type having legs 162 provided on opposing sides of the package 160.

Figure 10:
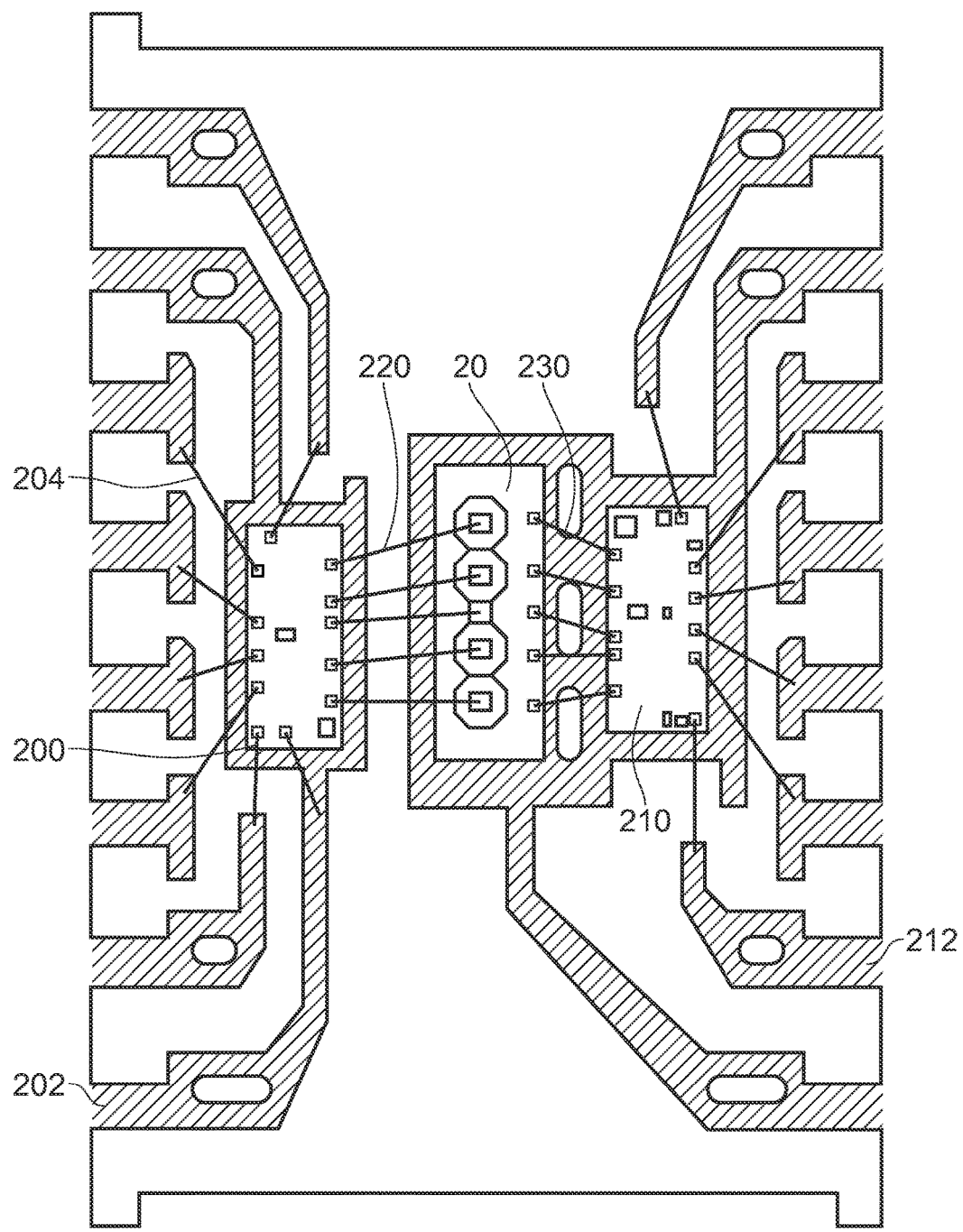
FIG. 10 is a plan view of a dual in line packaged isolator comprising three dies carried on two lead frames.

For diagrammatic simplicity, some of the bonds with the bond pads have been shown at a first lateral position (point P1) and a second lateral position (point P2), and it is to be understood that these extend from the bond pads to lead frames, as will be described later on with respect to FIG. 10.

The various dies within the package 160 are held within a mould compound 170 which serves to hold them in place, acts as an insulator, and provides environmental protection. As shown in greater detail in the expanded section 174, the mould compound 170 extends into the trenches 120 formed within the fourth layer of insulator 114, including trenches T1 and T2, thereby enhancing the mechanical and chemical bonds between the mould compound 170 and the insulating structure. This is advantageous since any gap between the surface of the insulating structure, i.e. the fourth layer 114 and the mould compound 170 can give rise to a breakdown path. Additionally, in use, as the semiconductor component ages it is possible for delamination to occur between the mould compound and the semiconductor dies formed therein. The delamination gives rise to the formation of a gap which could give rise to a surface breakdown mechanism. The enhanced mechanical bounding resulting from the surface structure mitigates the risk of such delamination occurring between the insulating component and the mould compound 170, thereby enhancing the longevity of the component, and allowing the manufacturer to provide a component that can be guaranteed to withstand a higher voltage between its high voltage and low voltage sides before breakdown might occur.

As noted with respect to FIG. 9, the various dies within the integrated circuit package need to connect with one another and need to connect with the legs 162. FIG. 10 shows a configuration of a three die isolator in which the receiver circuit 12 is carried on a first die 200 mounted on a first lead frame 202. Wire interconnections for example 204, are made between bond pads on the die 200 and respective bond regions of the lead frame 202. In the arrangement shown in FIG. 10 the output circuit 30 is formed on a die 210 which is carried on a second lead frame 212 together with the isolator 20. Wire connections extend between the first die 200 and the corresponding high voltage connections to the first transformer coil of the isolator 20. An example of one such connection is designated 220. Similarly connections, for example 230 extend between the second transformer coil and the die 210. The entire arrangement is embedded within the mould compound 170 described hereinbefore with respect to FIG. 9. In the arrangement shown in FIG. 10, a common return connection is provided for the transformer coils on the high voltage side, and a separate common return connection is provided for the transformer coils on the low voltage side so as to reduce the number of interconnections made to the isolator 20.

Figure 11:
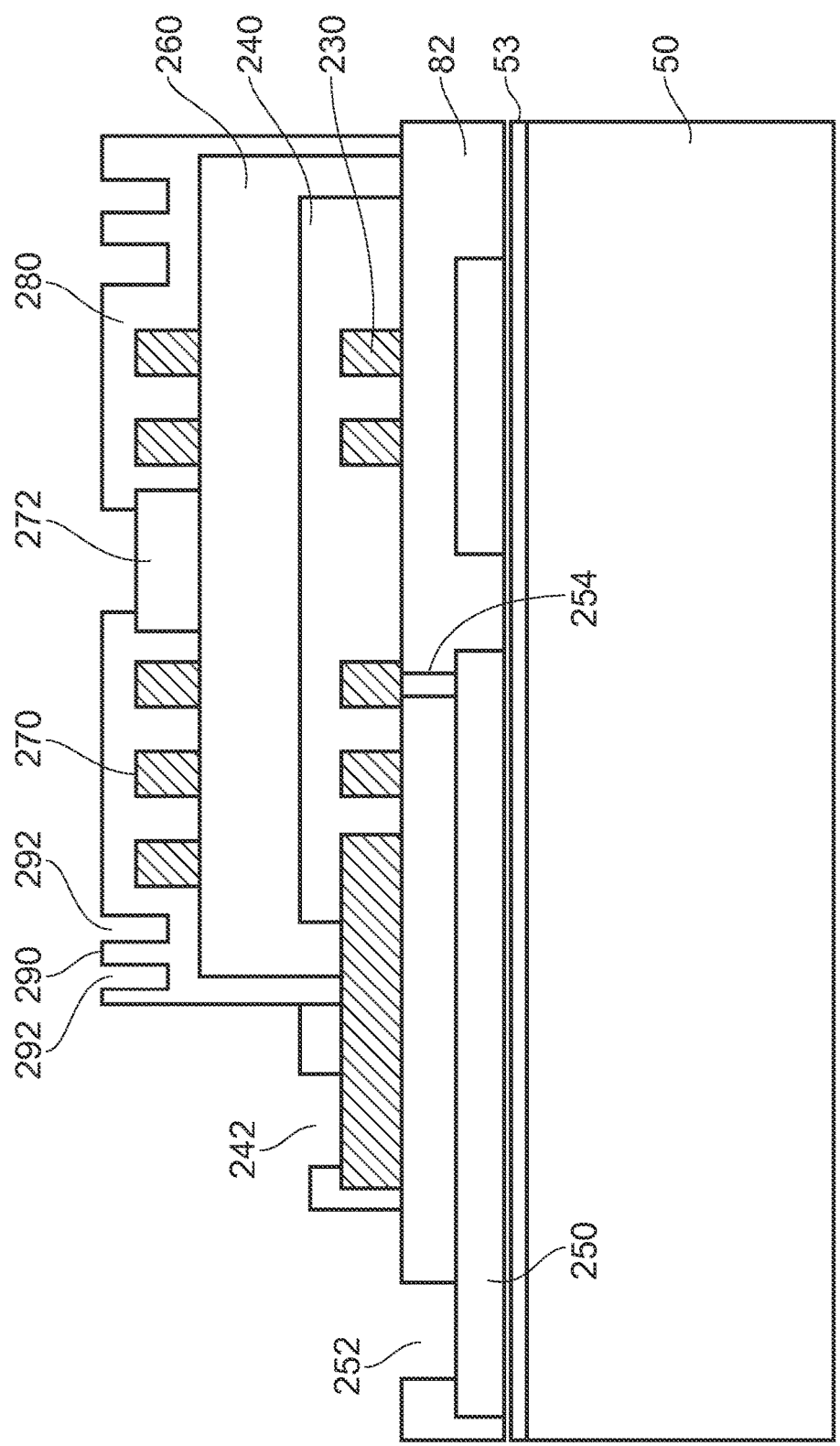
FIG. 11 is a schematic diagram showing a further configuration of an insulating structure.

FIG. 11 shows a further variation on the arrangement shown in FIG. 2 such that a lowermost transformer coil 230 is formed over an insulating layer such as the passivation 82 above a substrate 50. The first coil 230 may be embedded within a first layer of insulator 240, such as polyimide, BCB, SU8 or other suitable insulator. As shown, an outermost connection to the first coil 230 may be formed by extending the metallization to a first bond pad 242, and a connection to the innermost part of the coil 230 may be made by a further metallic strip 250 formed over the substrate (and on top of an insulating layer 53 placed over substrate if the substrate is silicon 50), extending between a further bond pad 252 and a via 254 that extends through the passivation 82 (or other insulating layer) to reach an innermost portion of the coil 230. A second layer of insulator 260 is formed over the first layer 240 and wraps around the edges of the layer 240 so as to enclose it. The layer 260 defines the minimum inter-coil distance, and hence the breakdown voltage between the coils of the transformers. Next a second coil 270 is formed over the second insulating layer 260 by metal deposition and patterning. A connection to the radially innermost part of the coil is represented by bond pad 272 whereas the outermost part of the coil has not been shown and is assumed to be above or below the plane of the diagram. Next, a third layer of insulator 280 is deposited over the second coil 270. Thus, comparing this arrangement with that shown in FIG. 2 it can be seen that a surface pattern in the form of walls 290 surrounded by corresponding trenches 292 are formed in the third layer 280 rather than in a further (fourth) layer of polyimide. For diagrammatic simplicity only one wall 290 has been shown surrounded by corresponding trenches, but it is to be assumed that multiple walls can be fabricated. For simplicity the, first, second and third (or indeed further) insulating layers may be made of the same material, but this is not a requirement.

Figure 12:
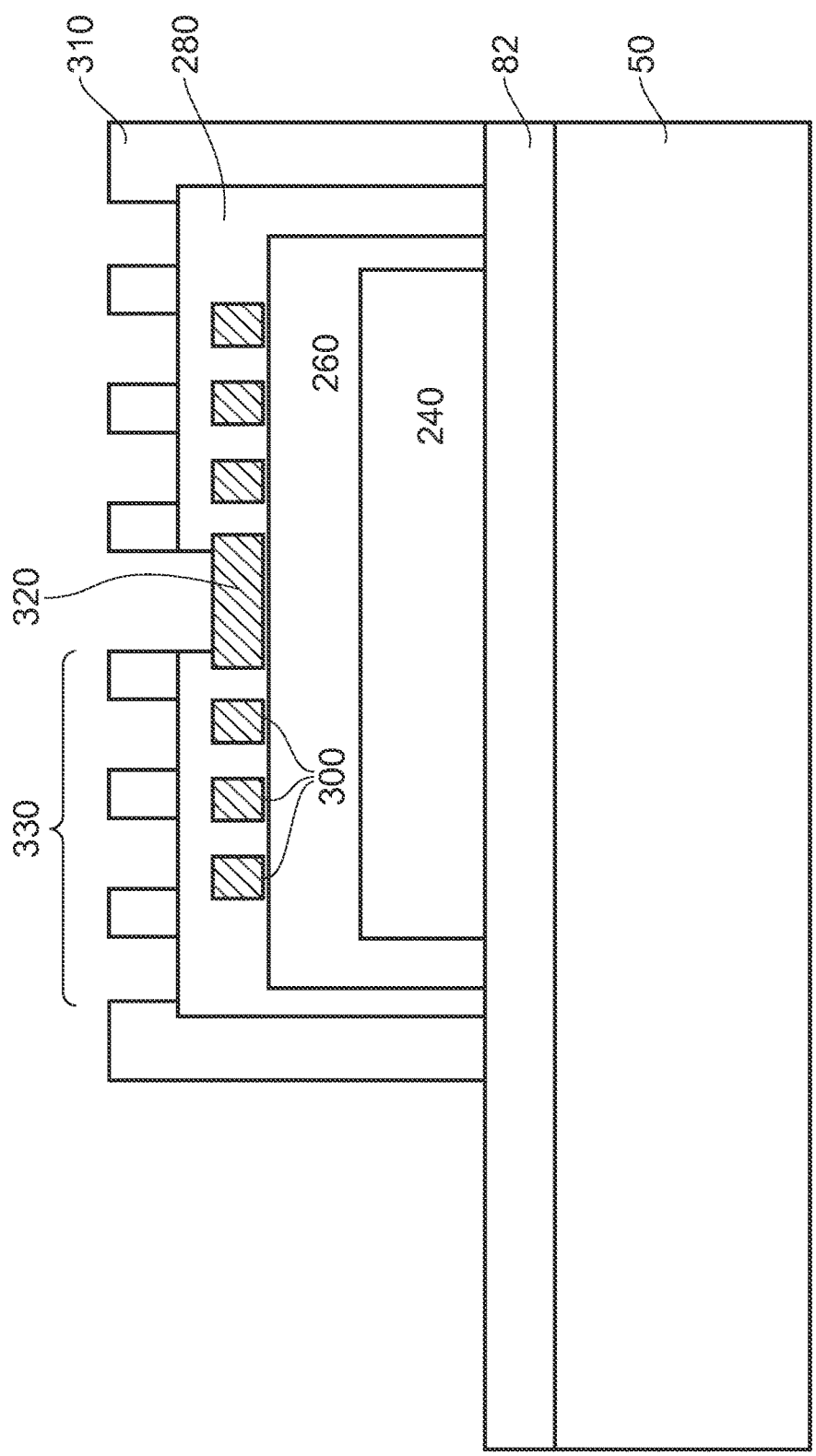
FIG. 12 is a schematic diagram illustrating a further variation of an insulating structure.

The arrangement described herein is not limited to the fabrication of transformers, and as shown in FIG. 12 only a single metallic spiral 300 might be formed so as to fabricate an inductor. Thus, the arrangement shown in FIG. 12 is similar to that shown in FIG. 11 except that the first spiral inductor 230 and metal layers to connect it to have been omitted. Furthermore, just to show the further variations which are possible, a fourth layer 310 of insulator has been deposited so as to overlie and surround the other layers, and then masked and etched so as to open up a connection to a bond pad 320 and also to form a surface structure 330 to facilitate engagement with the mould compound once the insulating structure has been placed within an integrated circuit package. The layers 240 and 260 beneath the component 280 may be regarded as forming M layers over the substrate, and the or each layer over the component 280 may be regarded as forming a further N layers.

Figure 13:
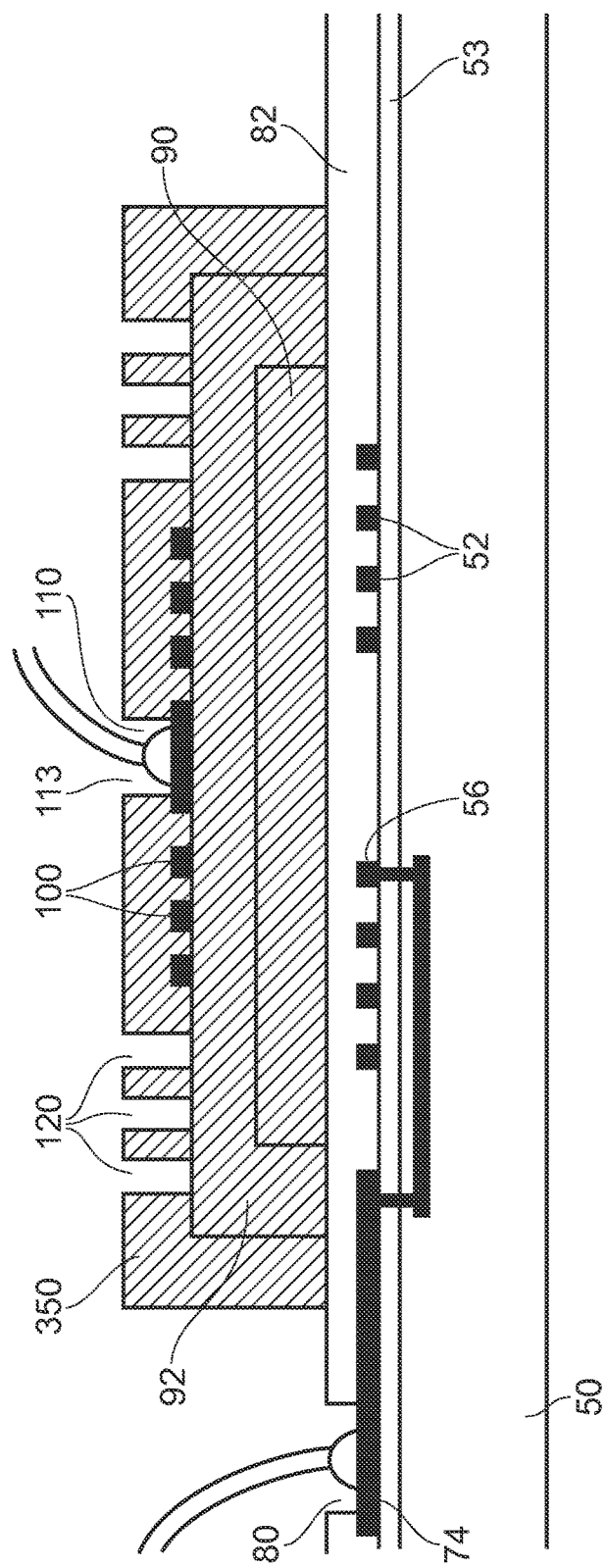
FIG. 13 is a schematic diagram of a further insulating structure and a transformer based isolator therein.

FIG. 13 shows a further variation which is similar to FIG. 2, and like parts have been identified with the like reference numbers. Comparing FIG. 13 with FIG. 2, the third and fourth layers 92 and 114 have been replaced by a single layer of insulator 350, for example of polyimide, having trenches 120 formed therein. Connections to the bond pads 80 and 110 are shown in FIG. 13.

Figure 14:
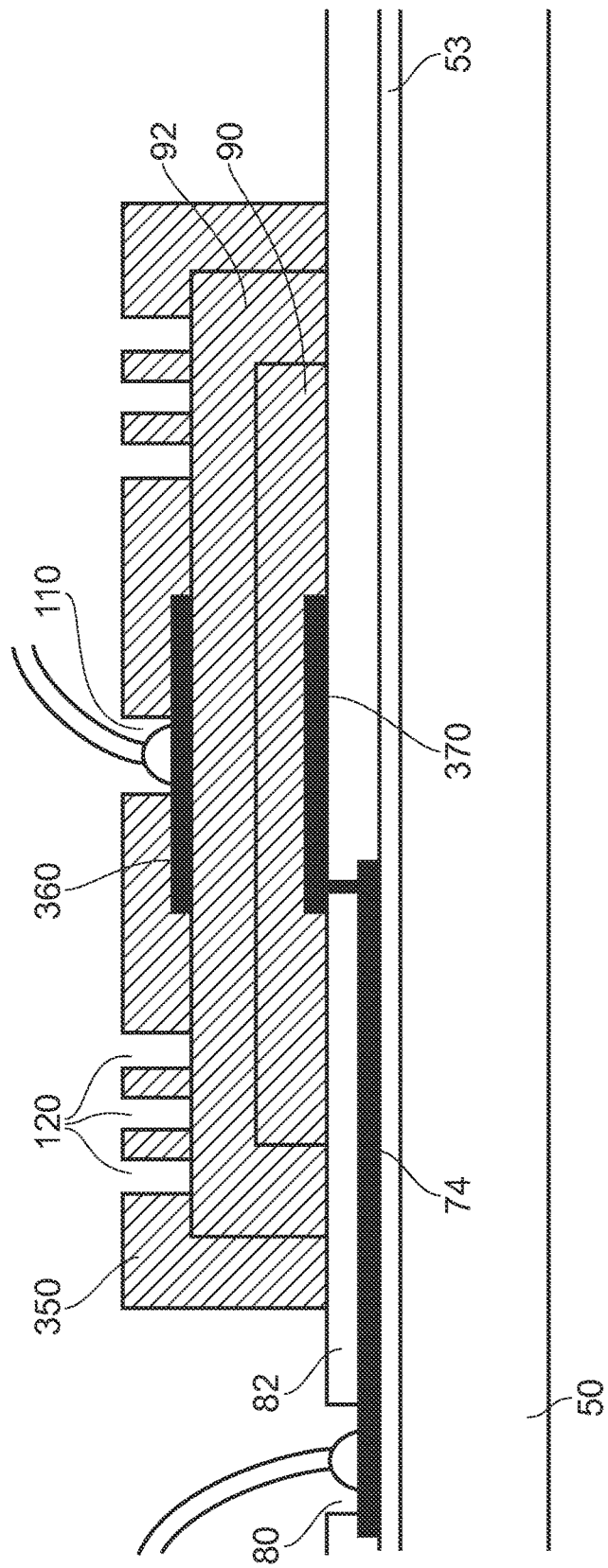
FIG. 14 is a schematic diagram of an insulating structure having a capacitor based isolator therein.

FIG. 14 is similar to FIG. 13 to the extent that the uppermost layer of insulator 350 covers an uppermost metal layer 360, and similar to FIG. 11 in that lower metal layer 370 has been formed over the passivation 82. However here the metal layers 360 and 370 have not been patterned to form inductors, but instead form plates of a capacitor. A lowermost metal layer 74 beneath the passivation 82 and over the oxide layer 53 can be used to provide a connection to the lowermost plate of the capacitor.

Each of these variations may, in use, be embedded in mould compound.

It is thus possible to improve the breakdown voltage of an insulating structure by at least one of: a) lengthening the surface breakdown path across an uppermost surface of the insulating structure; and b) improving the adhesion between the insulating structure and a further insulating material such as mould compound.

A further advantage of the arrangement described herein is that the surface structure can be fabricated at the same time as masking and etching the polyimide so as to open up apertures to make electrical contact to the bond pads. Thus, the enhanced breakdown voltage described by the provision of such a structure can effectively be fabricated for no additional cost.

The invention claimed is:

1. A method of forming an insulating structure, comprising
    forming an electrical contact region to a first transmitting or receiving element of an isolator;
    forming an electrical contact region to a second transmitting or receiving element of the isolator spatially separated from the first transmitting or receiving element of the isolator;
    forming an insulating layer extending at least part of a distance between the electrical contact region to the first transmitting or receiving element of the isolator and the electrical contact region to the second transmitting or receiving element of the isolator, the insulating layer having a nonplanar surface including at least first and second trenches between the electrical contact region to the first transmitting or receiving element of the isolator and the electrical contact region to the second transmitting or receiving element of the isolator, wherein a bottom boundary and side walls of each of the first and second trenches are formed of a same insulating material.

2. The method as claimed in claim 1, wherein the insulating layer is a first insulating layer, and wherein the method further comprises forming the first transmitting or receiving element of the isolator between the first insulating layer and a second insulating layer.

3. The method as claimed in claim 1, wherein forming the insulating layer comprises forming the insulating layer to cover sides of an underlying insulating layer.

4. The method as claimed in claim 1, wherein the first transmitting or receiving element and the second transmitting or receiving element form a transformer.

5. The method as claimed in claim 1, wherein forming the insulating layer comprises forming the insulating layer as an uppermost layer of the isolator.

6. The method as claimed in claim 1, further comprising forming the electrical contact region to the first transmitting or receiving element of the isolator as a high voltage contact region and the electrical contact region to the second transmitting or receiving element of the isolator as a low voltage contact region.

7. The method as claimed in claim 4, further comprising:
forming the second transmitting or receiving element on a substrate, and depositing M layers of insulator over a portion of the substrate containing the second transmitting or receiving element.

8. The method as claimed in claim 6, in which the second transmitting or receiving element forms part of a transformer.

9. The method as claimed in claim 1, further comprising packaging the insulating structure within an integrated circuit package such that the first and second trenches are filled with a packaging mould compound within the integrated circuit package.

10. The method as claimed in claim 1, in which the insulating layer comprises polyimide or oxide.

11. The method as claimed in claim 1, further comprising forming a third trench within the insulating layer, wherein the first and third trenches are respectively adjacent to first and second sides of the electrical contact region to the first transmitting or receiving element.

12. The method as claimed in claim 1, wherein the at least first and second trenches are bounded by a plurality of walls.

13. The method as claimed in claim 9, wherein the packaging mould compound engages with the nonplanar surface of the insulating layer.

14. The method as claimed in claim 13, wherein the packaging mould compound encapsulates the isolator.

15. The method as claimed in claim 1, wherein forming the insulating layer comprises selectively etching the first and second trenches with a plasma etching process.

16. The method as claimed in claim 1, wherein forming the electrical contact region to the first transmitting or receiving element comprises forming the electrical contact region to the first transmitting or receiving element at a first lateral position and first vertical position of the isolator, wherein forming the electrical contact region to the second transmitting or receiving element comprises forming the electrical contact region to the second transmitting or receiving element at a second lateral position and a second vertical position of the isolator, and wherein the first and second trenches are formed at lateral positions between the first and second lateral positions and at a third vertical position such that the second vertical position is between the first and third vertical positions.

17. The method as claimed in claim 16, further comprising encapsulating the isolator in a packaging compound.

18. The method as claimed in claim 1, further comprising forming the first trench as a continuous trench in a plane of the insulating layer.

19. The method as claimed in claim 1, further comprising forming the first trench as a discontinuous trench in a plane of the insulting layer.

20. The method as claimed in claim 1, further comprising forming the first and second trenches as concentric trenches in a plane of the insulating layer.

* * * * *